(12) United States Patent
Humphries et al.

(10) Patent No.: US 9,299,938 B2
(45) Date of Patent: Mar. 29, 2016

(54) ELECTROLUMINESCENCE FROM A PLURALITY OF ELECTROLUMINESCENT ZONES IN A LATERALLY SEPARATED ARRANGEMENT

(71) Applicants: Sumitomo Chemical Company Limited, Tokyo (JP); Cambridge Display Technology Limited, Godmanchester (GB)

(72) Inventors: Martin Humphries, Godmanchester (GB); Martina Pintani, Godmanchester (GB); Ilaria Grizzi, Godmanchester (GB); Clare Foden, Cambridge (GB); Richard J. Wilson, Godmanchester (GB); Martial Berry, Bordeaux (FR)

(73) Assignees: Sumitomo Chemical Company Limited, Tokyo (JP); Cambridge Display Technology Limited, Godmanchester (GB)

( * ) Notice: Subject to any disclaimer, the term of this patent is extended or adjusted under 35 U.S.C. 154(b) by 0 days.

(21) Appl. No.: 14/373,144

(22) PCT Filed: Jan. 18, 2013

(86) PCT No.: PCT/GB2013/050109
§ 371 (c)(1),
(2) Date: Jul. 18, 2014

(87) PCT Pub. No.: WO2013/108037
PCT Pub. Date: Jul. 25, 2013

(65) Prior Publication Data
US 2015/0014670 A1   Jan. 15, 2015

(30) Foreign Application Priority Data

Jan. 18, 2012   (GB) .................................. 1200823.1

(51) Int. Cl.
*H01L 51/56*   (2006.01)
*H01L 51/00*   (2006.01)
*H01L 51/50*   (2006.01)
(Continued)

(52) U.S. Cl.
CPC ........ *H01L 51/0085* (2013.01); *H01L 51/0035* (2013.01); *H01L 51/5012* (2013.01);

(58) Field of Classification Search
CPC . H01L 51/0085; H01L 51/56; H01L 51/0035; H01L 51/5056
See application file for complete search history.

(56) References Cited

U.S. PATENT DOCUMENTS

| 4,954,747 A * | 9/1990 | Tuenge ............... C09K 11/7702 |
| | | 313/112 |
| 5,705,285 A * | 1/1998 | Shi et al. ....................... 428/690 |

(Continued)

FOREIGN PATENT DOCUMENTS

| WO | WO 95/31515 A1 | 11/1995 |
| WO | WO 2006/015004 A2 | 2/2006 |

(Continued)

OTHER PUBLICATIONS

International Search Report and Written Opinion for International Application No. PCT/GB2013/050109 mailed Apr. 17, 2013.

(Continued)

*Primary Examiner* — Ida M Soward
(74) *Attorney, Agent, or Firm* — Wolf, Greenfield & Sacks, P.C.

(57) ABSTRACT

A white light emitting device having an anode and a cathode and therebetween an organic electroluminescent layer which emits white light on the provision of a current between the anode and the cathode, said organic electroluminescent layer including a plurality of electroluminescent zones in laterally separated arrangement, the first of said electroluminescent zones including a first polymer and the second of said electroluminescent zones including a second polymer, wherein the first polymer includes a fluorescent blue light emitting species and the second polymer includes a fluorescent green light emitting species, said first and/or second zones further including a phosphorescent red light emitting species, such that together with the blue emitting species results in the emission of white light, said first and second polymers being physically incompatible so that separation of the zones pertains.

20 Claims, 1 Drawing Sheet

(52) U.S. Cl.
CPC ............. *H01L51/56* (2013.01); *H01L 51/5036* (2013.01); *H01L 51/5056* (2013.01); *H01L 51/5072* (2013.01); *H01L 2251/5376* (2013.01)

(56) References Cited

U.S. PATENT DOCUMENTS

| | | | |
|---|---|---|---|
| 5,925,897 A * | 7/1999 | Oberman | 257/80 |
| 5,926,239 A * | 7/1999 | Kumar et al. | 349/69 |
| 6,008,578 A * | 12/1999 | Chen | H01L 27/322 313/498 |
| 6,046,714 A * | 4/2000 | Lim | 345/81 |
| 6,072,198 A * | 6/2000 | Sun et al. | 257/103 |
| 6,075,316 A * | 6/2000 | Shi et al. | 313/504 |
| 6,133,692 A * | 10/2000 | Xu et al. | 313/506 |
| 6,137,221 A * | 10/2000 | Roitman et al. | 313/504 |
| 6,215,250 B1 | 4/2001 | Hirano et al. | 315/169.3 |
| 6,245,393 B1 * | 6/2001 | Thompson et al. | 427/511 |
| 6,309,486 B1 * | 10/2001 | Kawaguchi et al. | 156/67 |
| 6,716,662 B2 * | 4/2004 | Akai | 438/99 |
| 6,870,186 B2 * | 3/2005 | Park et al. | 257/59 |
| 6,967,435 B2 * | 11/2005 | Park et al. | 313/501 |
| 7,030,553 B2 * | 4/2006 | Winters et al. | 313/504 |
| 7,061,176 B2 * | 6/2006 | Kobayashi | 313/506 |
| 7,067,975 B2 * | 6/2006 | Chen et al. | 313/512 |
| 7,129,632 B2 * | 10/2006 | Park et al. | 313/503 |
| 7,768,194 B2 * | 8/2010 | Forrest et al. | 313/504 |
| 8,063,559 B2 * | 11/2011 | Racine et al. | 313/509 |
| 8,945,722 B2 * | 2/2015 | Thompson et al. | 428/690 |
| 2004/0092196 A1 * | 5/2004 | Van De Witte et al. | 445/24 |
| 2004/0164292 A1 * | 8/2004 | Tung et al. | 257/40 |
| 2004/0164671 A1 | 8/2004 | Noguchi | |
| 2005/0017621 A1 | 1/2005 | Leo | |
| 2006/0006797 A1 * | 1/2006 | Ito et al. | 313/506 |
| 2006/0273714 A1 | 12/2006 | Forrest et al. | |
| 2006/0279203 A1 * | 12/2006 | Forrest | H01L 51/0072 313/504 |
| 2007/0029906 A1 * | 2/2007 | Hack et al. | 313/24 |
| 2008/0258606 A1 * | 10/2008 | Butler et al. | 313/504 |
| 2010/0096978 A1 * | 4/2010 | Wilson | 313/504 |
| 2011/0127906 A1 * | 6/2011 | Mitsuya et al. | 313/504 |
| 2012/0097936 A1 * | 4/2012 | Ahn | H01L 51/5036 257/40 |
| 2013/0020933 A1 * | 1/2013 | Levermore et al. | 313/504 |
| 2013/0240859 A1 * | 9/2013 | Arakane | C09K 11/06 257/40 |
| 2014/0048789 A1 * | 2/2014 | Park | C09K 11/06 257/40 |

FOREIGN PATENT DOCUMENTS

| | | |
|---|---|---|
| WO | WO 2007/007240 A1 | 1/2007 |
| WO | WO 2008/082665 A2 | 7/2008 |
| WO | WO 2011/028475 A2 | 3/2011 |
| WO | WO 2011/059789 A2 | 5/2011 |

OTHER PUBLICATIONS

International Preliminary Report on Patentability for International Application No. PCT/GB2013/050109 mailed Jul. 31, 2014.
Office Communication dated Jul. 16, 2012 for Great Britain Application No. GB1200823.1.

* cited by examiner

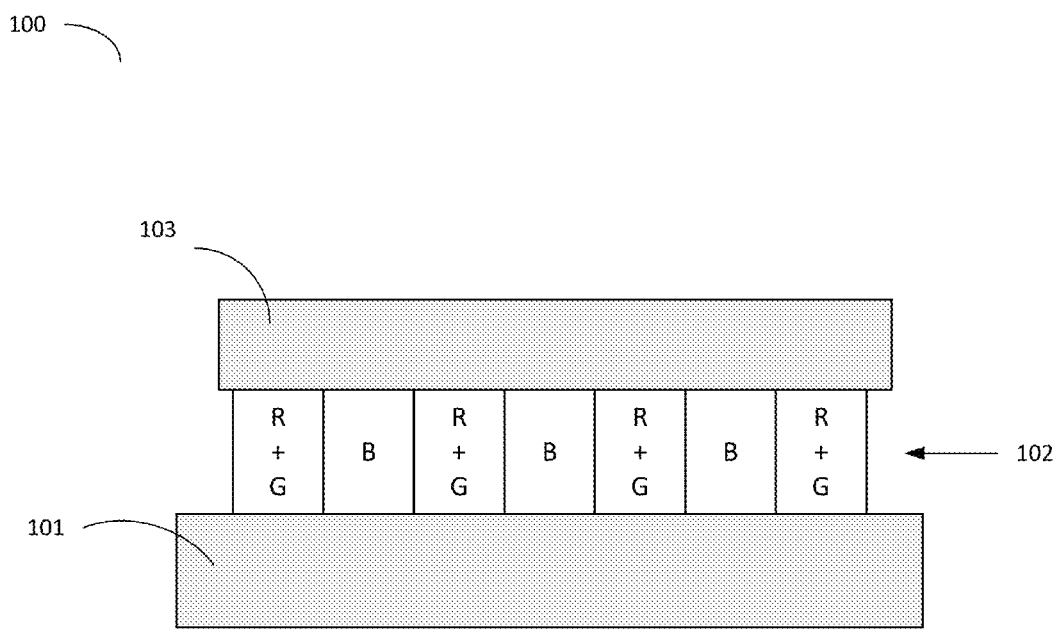

ELECTROLUMINESCENCE FROM A PLURALITY OF ELECTROLUMINESCENT ZONES IN A LATERALLY SEPARATED ARRANGEMENT

RELATED APPLICATIONS

The present application is a national stage filing under 35 U.S.C. §371 of international PCT application, PCT/GB2013/050109, filed Jan. 18, 2013, which claims priority to United Kingdom patent application, GB 1200823.1, filed Jan. 18, 2012, each of which is incorporated herein by reference.

FIELD OF THE INVENTION

The present invention relates to electroluminescence, specifically to white light emitting electroluminescent devices, methods of their manufacture and components therefore.

BACKGROUND TO THE INVENTION

Organic Light Emitting Diode (OLED) devices can be configured to emit white light and, as such are likely to have utility in providing, inter alia, cheap and efficient lighting, for example for homes, buildings and offices.

In order to provide a white light OLED it is apt to have red, green and blue light-emissive species appropriately provided within the device to ensure that the blend of emitted light is usable for general lighting purposes. The provision of distinct red, green and blue emitters leads performance issues and/or to complexities in device manufacture, for example, insufficient emissions intensities or multiple solvent employing manufacturing steps (which occur in the provision a plurality of distinct emission layers).

In manufacturing electroluminescent devices such as white light emitting devices, multiple electroluminescent layers may be stacked upon one another, whereby each layer comprises an electroluminescent material having an emission spectrum which differs from that of the other layers. For instance, a multi layer device may comprise a red emission layer having a green emission layer deposited thereon, the green emission layer itself having a blue emission layer deposited thereon. However, such multi layer architecture results in devices which have low quantum efficiency and/or experience quenching.

Typically the highest efficiency devices would employ blue, green and red phosphorescent emitters. However, where fluorescent blue is used with phosphorescent green and red, such a multilayer device results in low quantum efficiency and/or experience considerable quenching.

Quenching of phosphorescent green chromophores typically occurs when the energy of the green triplet state is greater than the non-emissive fluorescent blue triplet state. Thus energy is transferred from the phosphorescent green triplet to the fluorescent blue triplet and no longer emits light.

Moreover, solution processed multi layer devices can be time consuming to construct because each layer must be deposited and allowed to dry before the next layer can be applied.

It has been suggested that multiple layers of white light emitting devices based upon fluorescent blue and phosphorescent green emitters can be avoided by employing lateral separation of the fluorescent blue and phosphorescent green emitters. One method of achieving this is by printing discrete areas of different light emitting characteristics, but this requires dedicated printing equipment which is not always available. Another possibility is described in WO 2006/064183 which avoids the need for printing equipment. The method described therein forms a porous layer in a polymer by leaching out a soluble material from a composite layer and then forming an interpenetrating layer of a second polymer. Such a process is cumbersome and a simpler process would be useful.

It is desirable to provide a device which has appropriate performance characteristics and in which manufacture complexity, such as that described in WO 2006/064183, is reduced. Hence, it is desirable to produce, in an OLED device, a single light emitting layer that is quicker and simpler to fabricate, has good quantum efficiency and which experiences acceptable degrees of quenching.

BRIEF DESCRIPTION OF THE INVENTION

There is provided a white light emitting device having an anode and a cathode and therebetween an organic electroluminescent layer which emits white light on the provision of a current between the anode and the cathode, said organic electroluminescent layer comprising a plurality of electroluminescent zones in laterally separated arrangement, the first of said electroluminescent zones comprising a first polymer and the second of said electroluminescent zones comprising a second polymer, wherein the first polymer comprises a fluorescent blue light emitting species and the second polymer comprises a phosphorescent green light emitting species, said first and/or second zones further comprising a phosphorescent red light emitting species, such that together with the blue emitting species results in the emission of white light, said first and second polymers being physically incompatible so that separation of the zones pertains.

The red light emitting species may be present in either of both zones. The red light emitting species is aptly present in the same polymer as the green emitting species.

BRIEF DESCRIPTION OF THE FIGURES

FIG. 1 is a diagram illustrating a light-emitting device, according to some embodiments.

DETAILED DESCRIPTION OF THE INVENTION

There is provided a white light emitting device having an anode and a cathode and therebetween an organic electroluminescent layer which emits white light on the provision of a current between the anode and the cathode, said organic electroluminescent layer comprising a plurality of electroluminescent zones in laterally separated arrangement, the first of said electroluminescent zones comprising a first polymer and the second of said electroluminescent zones comprising a second polymer, wherein the first polymer comprises a fluorescent blue light emitting species and the second polymer comprises a phosphorescent green light emitting species, said first and/or second zones further comprising a phosphorescent red light emitting species, such that together with the blue emitting species results in the emission of white light, said first and second polymers being physically incompatible so that separation of the zones pertains.

FIG. 1 is a diagram illustrating an exemplary light-emitting device 100. The white light-emitting device 100 comprises an anode 101, a cathode 103, and a white-light emitting electroluminescent layer 102 comprising a plurality of electroluminescent zones in a laterally separated arrangement. In the example of FIG. 1, electroluminescent zones labeled (B) comprise a first polymer comprising a fluorescent blue light-emitting species. Electroluminescent zones labeled (G) comprise a second polymer comprising a phosphorescent green light-emitting species. In addition, a phosphorescent red light-emitting species labeled (R) is provided in the electroluminescent zones labeled (G), although in general this species may be provide in only the first zone, only the second zone, or in both the first and the second zones.

To form the device, a solution containing a fluorescent blue light-emitting species (B), a fluorescent green light-emitting species (G), and a phosphorescent red light-emitting species (R) may be deposited onto a surface of anode 101, or alternatively on another surface, for example the surface of a hole-transporting layer. The cathode 103 may be formed over the laterally separated organic electroluminescent layer.

The blue light emitting species is incorporated (covalently bound) into a polymer. The green light emitting species is incorporated (covalently bound) into a polymer. The red emitting species may present in either or both zone, but need not be incorporated (covalently bound) into a polymer. However, it is apt if the red emitting species is in one of the two zones, that is it is present together with the blue emitting polymer or alternatively together with the green emitting polymer. It is believed to be more suitable if the red emitting species is also incorporated (covalently bound) into the polymer which also comprises a blue emitting species or the green emitting species. It is believed that incorporation of both the red emitting species and the green emitting species into the same polymer is particularly suitable.

The red and blue emitters may be any suitable organic emitter. The skilled person is aware of a plethora of such emitters, for example a red emitter is derived from:

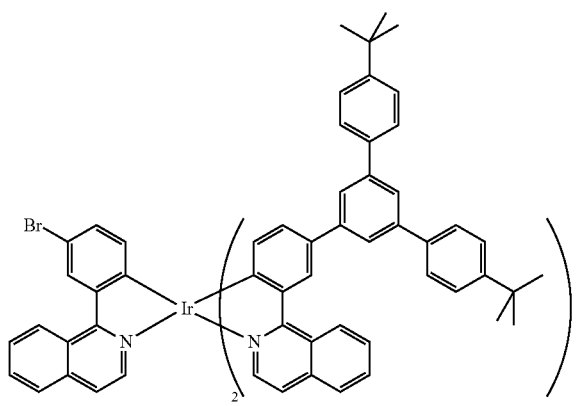

However it is particularly apt that the green emitter is an iridium containing dendrimer. A green emitter believed to be particularly apt is derived from:

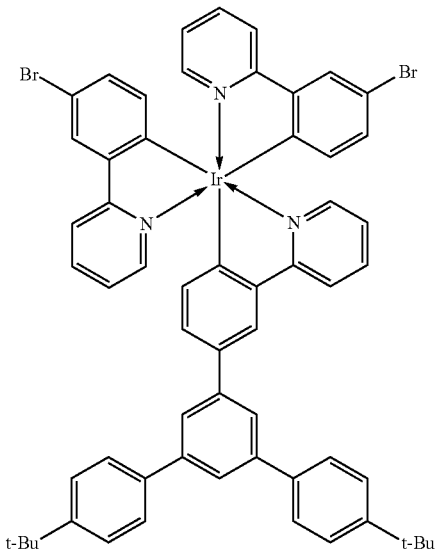

The physical incompatibility of the first polymer and the second polymer is such as for them to be immiscible with each other. This lends itself to producing a device which has acceptable stability.

The first polymer has at least one different physiochemical characteristic to the second polymer. Hence when dissolved in a solvent the first and second polymers may be deposited therefrom, for example on evaporation of the solvent, differentially so that the different zones form.

The mutual incompatibility of the first and second polymers may be achieved by selection of their chemical constituents.

A first way of providing incompatible polymers is for one of the polymers to comprise more "polar" moieties and for the other of the polymers to comprise more "non-polar" moieties. "Polar" moieties include those which possess a side chain containing oxygen atoms, for example when present in a polyalkylene oxide side chain such as a polyethyleglycol side chain. "Non-polar" moieties include those which possess a side chain which is hydrocarbon such as an alkyl or alkenyl side chain. The skilled person will understand therefore that polar moieties are relatively more hydrophilic in comparison to the non-polar moieties which are relatively more hydrophobic.

One polymer may comprise polar residues and the second polymer may comprise no or relatively fewer polar residues so that they are immiscible with each other.

Suitable polar residues include those of the formula —O—$(CH_2CH_2)_n OCH_2CH_3$ wherein n is 1 to 10, for example 1, 2, 3, 4, 5, 6, 7, 8, 9 or 10 or mixtures thereof. Analogous groups terminated by a $OCH_3$ or other alkoxyl group may also be employed. Mixtures of oxyethyl and other oxyalkylenes such as oxypropyl or oxybutyl groups may also be employed but presently it is considered apt to use groups as set out above where n is 1, 2 or 3 particularly since suitable phase separation has been achieved where n is 1.

Particularly suitable polar residues containing repeat units include those of formula:

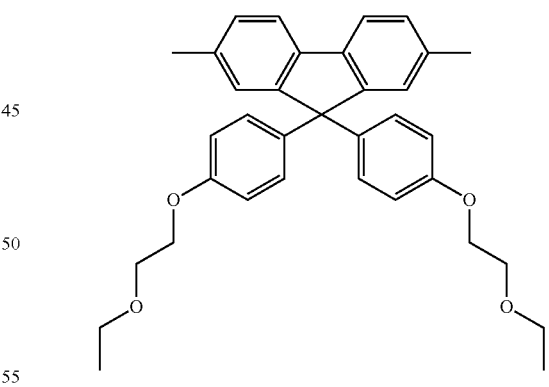

The polar residue can be a substituent on any suitable repeat unit. Aptly the polar substituent can be carried by a phenyl group, such as one which is itself a substituent on the methylene carbon atom of a fluorene.

The other polymer may comprise non-polar residues and have no or relatively few polar residues.

Typical non-polar residues include optionally fluorinated alkyl groups of 4 to 12 carbon atoms. Fluorinated alkyl groups may be perfluoro or have a mixture of hydrogen atoms and fluorine atoms, for example a terminal $CF_3$ group at the end of a series of methylene groups.

Suitable alkyl groups include those carried by a phenyl ring, for example of the formula —$C_6H_4$—$(CH_2)_p CH_3$ where p is an integer from 5 to 10, such as 5, 6, 7, 8, 9 or 10. Aptly p is five.

The alkylphenyl group may be on the methylene carbon linking the two phenyl rings of a fluorene.

Particularly, suitable non-polar substituted repeat units are of the formula:

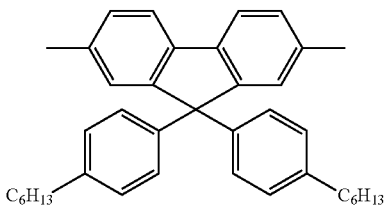

It is apt for one of the polymers to comprise at 30-95% and preferably 40-70% polar moieties while the other comprises at least 40%, and preferably at least 60%, of non-polar moieties (% are molar % of monomers).

A second way of providing a first polymer and a second polymer which are immiscible is to select one of the polymers to be a "rigid rod polymer" and the other to be a "coil" polymer.

Suitable "rigid rod polymers" include those which are comprised of polyarylene or polyfluorene moieties.

Suitable "coil" polymers include those which are comprised of polystyrenes, polyacrylates or polymethacrylates.

Such rigid and coil polymers may also be adapted to contain polar and non-polar groups as set forth hereinbefore.

By use of these methods, the first polymer has at least one different physiochemical characteristic to the second polymer, e.g. the first polymer is substantially more or substantially less soluble than the second polymer in at least one solvent such that the polymers phase separate upon mixing solutions or by evaporation of the solvent from a co-solution.

Advantageously, this achieves the effect that the first polymer/second polymer phase behaviour can be controlled through choice of solvent. For example, it is envisaged that the first polymer may fall out of solution before or after the second polymer upon evaporation of the solvent leading to isolated regions of the first and second polymer along the major plane of the deposited electroluminescent layer. In other words, the polymers, and any components, such as luminescent species, comprised therein, will become laterally separated along the major plane of the device.

Without wishing to be bound to any particular theory we believe that spatial separation of the different chromophores into laterally separated zones that are larger than the diffusion length of the excitons can improve efficiency by preventing, or substantially reducing, quenching.

The electroluminescent layer is interposed between a pair of electrodes, such as an anode and a cathode of an OLED.

Preferably, the device further comprises a hole transporting layer, such as an interlayer located between the anode and the electroluminescent layer.

Aptly, the hole transporting layer may have a highest occupied molecular orbital (HOMO) level of less than or equal to 5.5 eV, more aptly around 4.8-5.5 eV.

Optionally, the device further comprises an electron transporting layer, e.g. located between the cathode and the electroluminescent layer. The device of this invention may optionally have further layers such as those conventionally employed in OLEDs, for example a layer comprising ITO. Similarly, one of the anode and cathode is transparent or translucent to permit emergence of the white light form the device.

If present, the electron transporting layer may have a lowest unoccupied molecular orbital (LUMO) level of around 1.8-3 eV.

A further aspect of the invention provides a device as set forth hereinbefore formed by depositing a single layer of a solution, the solution comprising at least two electroluminescent species as described herein, wherein the solution phase separates along a major plane of the device to form first and second zones, wherein the first zone comprises one of the electroluminescent species and the second zone comprises the other of the electroluminescent species.

Preferably, the electroluminescent layer is deposited onto a common host substrate.

In another aspect the invention provides a method for manufacturing a device of the invention, the method comprising dissolving first and second polymers into a solvent to form a solution; and depositing the solution onto a surface such that the first and second polymers phase separate along a major plane of the surface to form first and second zones, wherein the first zone comprises a fluorescent blue light emitting moiety and the second zone comprises a phosphorescent green light emitting moiety.

Aptly a red emitting moiety will also be present in either or both the first and second polymers.

The phase separation may be effected by at least one of polymer solubility, choice of repeat units, molecular architecture, composition or other effect, for example as described hereinbefore.

In another aspect the invention provides a method for manufacturing a white light emitting device, e.g. an electroluminescent device, the method comprising preparing application means to have at least first and second zones; applying the application means to a substrate, e.g. an electrode; and depositing first and second light emitting polymers onto the substrate, such that the regions of the substrate defined by the first zone comprise the first light emitting polymer and regions of the substrate defined by the second zone comprise the second light emitting polymer.

The separation into zones reduces the interaction between chromophores which can mutually quench each other, such as phosphorescent green and fluorescent blue as described earlier. Quenching is minimised by ensuring that the two species are further apart than the exciton diffusion length, thus it will be apparent that is preferable that the spatially separated zones be as large as possible.

The zones will be laterally separated, that is the two zones exist such that their interphases are out of the plane of the film, for example perpendicular to the plane of the film as it extends in the lateral direction. The sizes of the zones are small, for example they range from 30 nm to 50 nm across, more commonly from 50 nm to 100 nm. The zones are often isolated from each other and from further zones of the same polymer, but interconnection between like zones also occurs. Essentially the zones are formed randomly by separation (by evaporation or otherwise) of the solvent.

The electroluminescent layer may be formed on one of the electrodes or it may be formed on a layer of charge transporting material. If such an interlayer is present it may comprise conventional repeat units such as those described hereinafter.

Polymers which may comprise a first repeat unit selected from arylene repeat units may be as disclosed in, for example, Adv. Mater. 2000 12(23) 1737-1750 and references therein. Exemplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include groups such as $C_{1-20}$ alkyl or alkoxy; electron withdrawing groups such as fluorene, nitro or cyano; and substituents for increasing glass transition temperature (Tg) of the polymer.

Particularly preferred polymers comprise optionally substituted, 2,7-linked fluorenes, most preferably repeat units of formula 1:

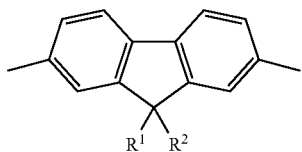

(1)

wherein $R^1$ and $R^2$ are independently selected from hydrogen or optionally substituted alkyl, alkoxy, aryl, arylalkyl, heteroaryl and heteroarylalkyl.

At least one of $R^1$ and $R^2$ comprises an optionally substituted $C_4$-$C_{20}$ alkyl or aryl group, when non-polar monomers are envisaged or polyether groups as hereinbefore described when a polar monomer is envisaged.

A polymer may provide one or more of the functions of hole transport, electron transport and emission depending on which layer of the device it is used in and the nature of co-repeat units.

Thus:
  a homopolymer of the first repeat unit, such as a homopolymer of 9,9-dialkylfluoren-2,7-diyl, may be utilised to provide electron transport.
  a copolymer comprising a first repeat unit and a triarylamine repeat unit, in particular a repeat unit of Formula 2:

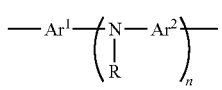

(2)

wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula 1 may be linked by a direct bond or a divalent linking atom or group. Preferred divalent linking atoms and groups include O, S; substituted N; and substituted C.

Preferred units satisfying Formula (2) include units of Formulae 3-5:

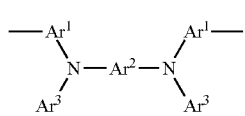

(3)

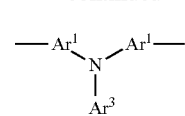

(4)

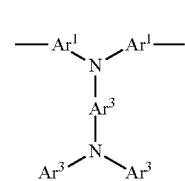

(5)

wherein $Ar^1$ and $Ar^2$ are as defined above; and $Ar^3$ is optionally substituted aryl or heteroaryl. Where present, preferred substituents for $Ar^3$ include alkyl and alkoxy groups.

a copolymer comprising a first repeat unit and heteroarylene repeat unit may be utilised for charge transport or emission. Preferred heteroarylene repeat units are selected from Formulae 6-21:

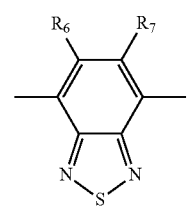

(6)

wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each, say, a phenyl group.

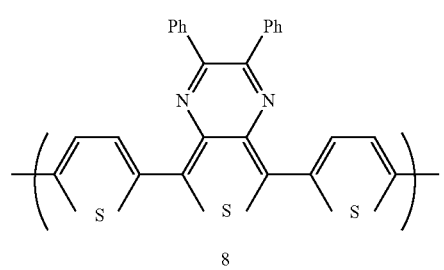

(7)

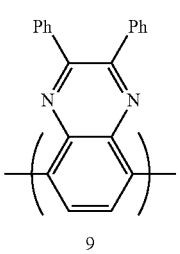

(8)

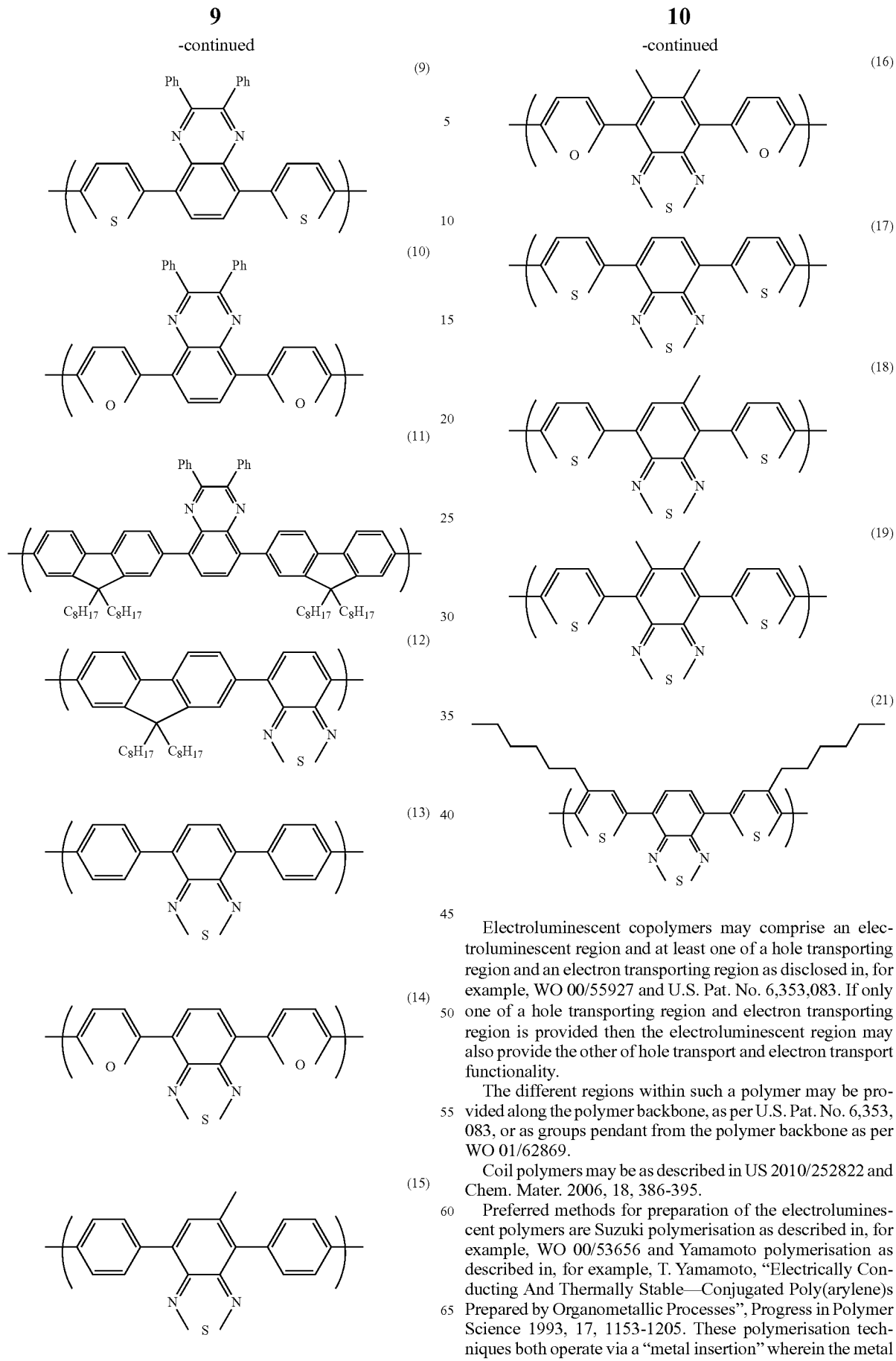

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Coil polymers may be as described in US 2010/252822 and Chem. Mater. 2006, 18, 386-395.

Preferred methods for preparation of the electroluminescent polymers are Suzuki polymerisation as described in, for example, WO 00/53656 and Yamamoto polymerisation as described in, for example, T. Yamamoto, "Electrically Conducting And Thermally Stable—Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups such as tosylate, mesylate and triflate.

By "red electroluminescent species" or equivalents thereof is meant an organic species that by electroluminescence emits radiation having a wavelength in the red range, for example of 580-680 nm, preferably 590-660 nm, more preferably 610-640 nm and most preferably having an emission peak around 590-620 nm, which combined with green emission and blue emission results in white light.

By "green electroluminescent species" or equivalents thereof is meant an organic species that by electroluminescence emits radiation having a wavelength in the range of 500-580 nm, preferably 510-550 nm.

By "blue electroluminescent species" or equivalents thereof is meant an organic species that by electroluminescence emits radiation having a wavelength in the range of 380-500 nm, more preferably 430-500 nm.

The electroluminescent species are generally present in the polymers in conventional amounts for the species, for example a green phosphorescent moiety may be present by from 2% to 10%, more usually from 5% to 7.5%, components which may originate from the amine and fluorene components may be present by from 0.01% to 2%, and the red phosphorescent moiety may be present from 0.01% to 2%, more usually from 0.05% to 1% (all % on mole/mole in terms of moles of emitter:moles of other repeated units).

The polymers may contain other conventional repeat units in conventional amounts.

The monomers for use in the present invention are known or may be prepared by processes analogous to those for the preparation of the known monomers.

The devices may be provided by forming the electroluminescent layer by precipitation from or by evaporation of a solvent or mixture of solvents from a solution of the first and second polymers. Suitable solvents include toluene, xylene, methylene chloride, cyclohexane and the like. Xylene is particularly apt.

Example 1

Preparation of Polymers

A phosphorescent green emitting polymer was prepared by reacting together A (50%), B (20%), C (10%), D (6.11%) and E (3.89%) under standard Suzuki reaction conditions.

A fluorescent blue, fluorescent green and phosphorescent red emitting polymer was prepared by reacting together F (40%), G (10%), H (39.8%), I (10%), J (0.1%) and K (0.1%) under standard Suzuki reaction conditions.

An interlayer polymer was prepared by reacting together A (50%), L (42.5%) and C (7.5%) under standard Suzuki reaction conditions.

The monomers have the structures:

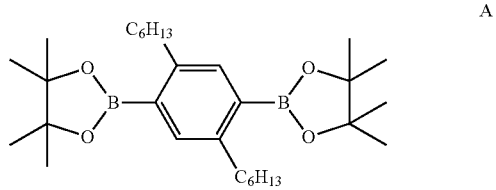

A

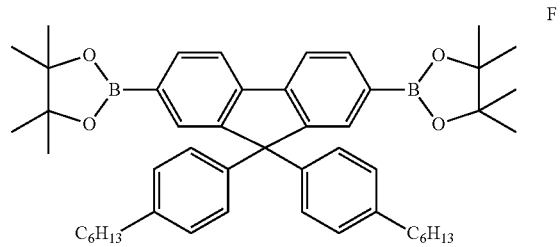

F

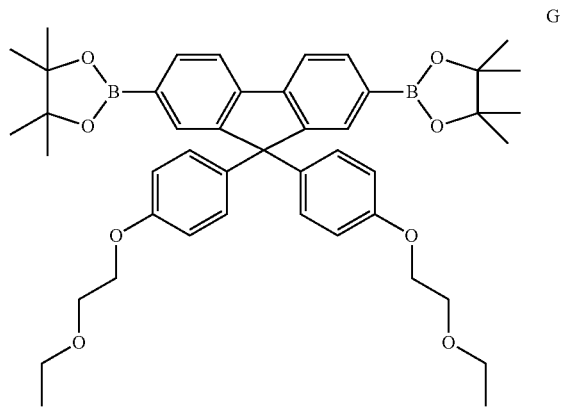

G

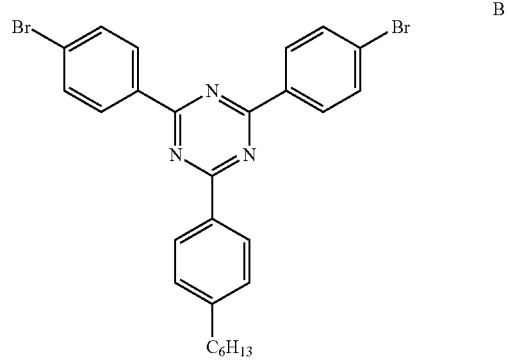

B

-continued

C 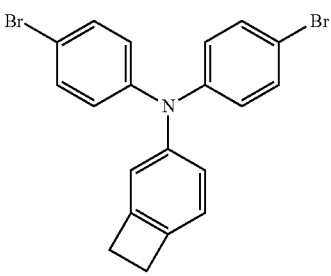

D 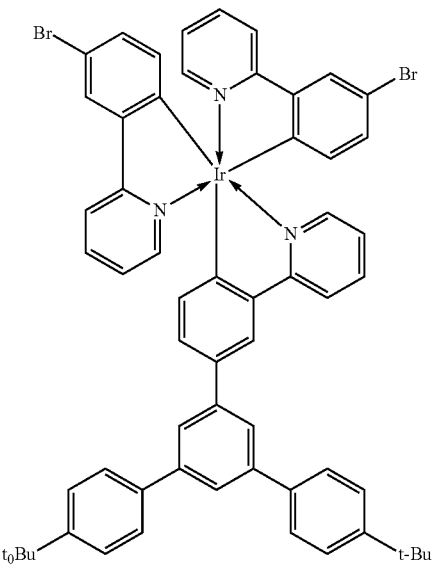

E 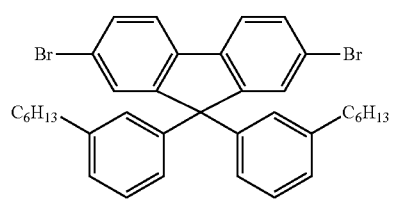

H 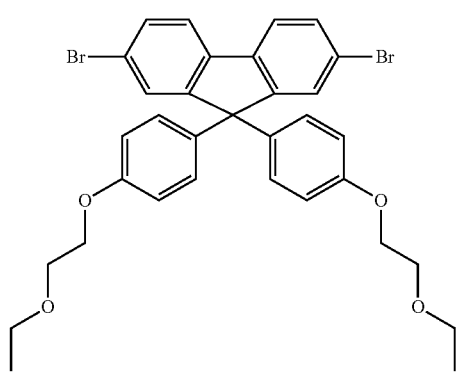 [SMILES: CCOCCOc1ccc(C2(c3ccc(OCCOCC)cc3)c3cc(C)ccc3-c3ccc(C)cc32)cc1]

-continued

I 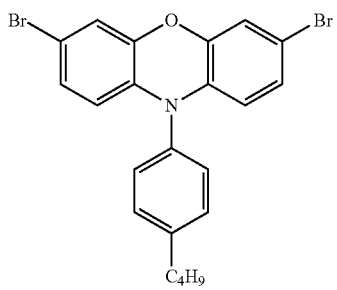

J 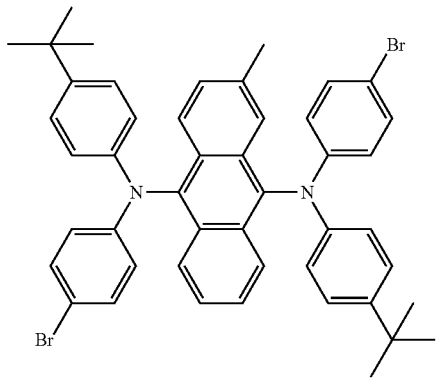

K

L

Example 2

A solution of the interlayer polymer of Example 1 was spread across an anode suitable for use in an OLED. The solvent was evaporated to form a layer of polymer.

A solution of both light emitting polymers of Example 1 in was spread across the interlayer and the solvent evaporated. This formed an electroluminescent layer with separate zones of the two polymers.

A cathode was applied to the electroluminescent layer.

The resulting OLED produced a good quality white light, good efficiency and did not suffer from unacceptable quenching.

The invention claimed is:

1. A white light emitting device having an anode and a cathode and therebetween an organic electroluminescent layer which emits white light on the provision of a current between the anode and the cathode, said organic electroluminescent layer comprising a plurality of electroluminescent zones in a laterally separated arrangement, the first of said electroluminescent zones comprising a first polymer and the second of said electroluminescent zones comprising a second polymer, wherein the first polymer comprises a fluorescent blue light emitting species and the second polymer comprises a phosphorescent green light emitting species, said first and/or second zones further comprising a phosphorescent red light emitting species, such that together with the blue emitting species results in the emission of white light, said first and second polymers being physically incompatible so that separation of the zones pertains.

2. A device as claimed in claim 1 wherein the red emitting species is incorporated into the same polymer as the green emitting species.

3. A device as claimed in claim 1 wherein the red emitting species is incorporated into the same polymer as the blue emitting species.

4. A device as claimed in claim 1 wherein the green phosphorescent emitter is an iridium containing dendrimer.

5. A device as claimed in claim 4 wherein the green phosphorescent emitter is a repeat unit of formula:

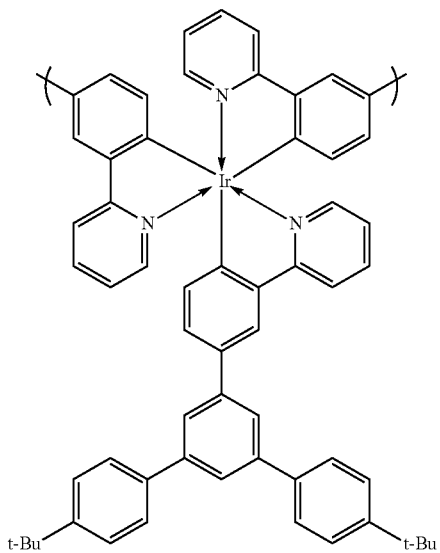

6. A device as claimed in claim 1 wherein repeat units of the first polymer comprises polar residues and repeat units of the second polymer comprises no or relatively fewer polar residues.

7. A device as claimed in claim 6 wherein the polar residues are polyether groups of formula —O—$(CH_2CH_2)_n$OCH$_2$CH$_3$ wherein n is 1 to 10.

8. A device as claimed in claim 6 wherein the polar residues form part of a substituent of formula —C$_6$H$_4$—O—$(CH_2CH_2)_n$OCH$_2$CH$_3$.

9. A device as claimed in claim 8 wherein the polar residues are on the methylene carbon atom between the two phenyl rings in a fluorene.

10. A device as claimed in claim 6 wherein the polar group is a substituent on the green phosphorescent emitter.

11. A device as claimed in claim 6 wherein repeat units comprising polar residues comprise 30%-95% (by mole) of the polymer.

12. A device as claimed in claim 6 wherein repeat units of the second polymer comprises non-polar residues and no or relatively fewer polar residues.

13. A device as claimed in claim 12 wherein the non-polar residues are optionally fluorinated alkyl groups of 4 to 12 carbon atoms.

14. A device as claimed in claim 12 wherein the non-polar residues are alkyl groups which form part of a substituent of the formula —C$_6$H$_4$—$(CH_2)_p$CH$_3$ where p is an integer from 3 to 10.

15. A device as claimed in claim 14 wherein the non-polar residues are on the methylene carbon atom linking the two phenyl rings of in a fluorene.

16. A device as claimed in claim 1 wherein one of the first polymer and second polymer is a rod polymer and the other is a coil polymer.

17. A device as claimed in claim 16 wherein the rod polymer is a polyfluorene.

18. A device as claimed in claim 16 wherein the coil polymer comprises a polystyrene, a polymethacrylate or a polymethylmethacrylate backbone.

19. A method of providing a device as claimed in claim 1 wherein the electroluminescent layer is formed by precipitation from or evaporation of a solvent or mixture of solvents from a solution of the first and second polymers.

20. A polymer which emits light when employed in a device as set forth in claim 1 wherein repeat units of the first polymer comprises polar residues and repeat units of the second polymer comprises no or relatively fewer polar residues.

* * * * *